United States Patent
McNulty

(10) Patent No.: US 6,323,638 B2
(45) Date of Patent: *Nov. 27, 2001

(54) HIGH-RESISTANCE PROBE AND VOLTAGE DETECTOR INCORPORATING SAME

(75) Inventor: William J. McNulty, River Forest, IL (US)

(73) Assignee: HD Electric Company, Waukegan, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,862

(22) Filed: Apr. 1, 1999

(51) Int. Cl.[7] ................................. G01R 31/02
(52) U.S. Cl. .................... 324/149; 324/133; 324/72.5
(58) Field of Search ................... 324/72.5, 133, 324/149, 555, 556, 754

(56) References Cited

U.S. PATENT DOCUMENTS

| | | | |
|---|---|---|---|
| 3,513,388 | * 5/1970 | Strachan | 324/72.5 |
| 3,522,533 | * 8/1970 | Bergero | 324/149 |
| 3,596,177 | * 7/1971 | Butera | 324/72.5 |
| 3,826,981 | * 7/1974 | Ross | 324/72.5 |
| 4,418,314 | * 11/1983 | Nieto | 324/72.5 |
| 4,503,389 | 3/1985 | Singer | 324/133 |
| 5,000,179 | * 3/1991 | Brehier | 607/30 |
| 5,136,234 | * 8/1992 | Shaw | 324/72.5 |
| 5,952,820 | * 9/1999 | Thrasher et al. | 324/133 |
| 6,124,714 | * 9/2000 | McNully et al. | 324/418 |

OTHER PUBLICATIONS

HD Electric Brochure for Tag Voltage Detectors (1998), particularly Tag 200/Tag 200MR Detectors and IEP–UD Insulated Underground Bushing Probe. (Month Unavailable).

* cited by examiner

Primary Examiner—Glenn W. Brown
Assistant Examiner—Vincent Q. Nguyen
(74) Attorney, Agent, or Firm—Seyfarth Shaw

(57) ABSTRACT

A device for testing a conductor for the presence of high AC voltage includes a voltage detection circuit connected to a probe assembly, preferably designed for insertion in the access bushing of an underground electrical transmission or distribution equipment. The probe assembly includes an elongated tubular insulating housing with a conductive probe at one end and a threaded connector at the other end for connection to the detection circuit. A high resistance, preferably several megohms, is connected in series between the tip and the connector and is preferably comprised of a plurality of series-connected resistors encased in a heat shrink tubing.

20 Claims, 2 Drawing Sheets

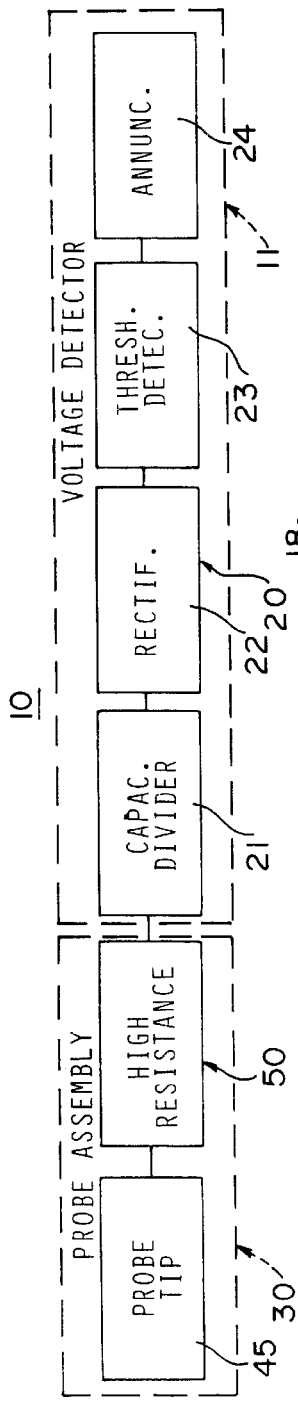
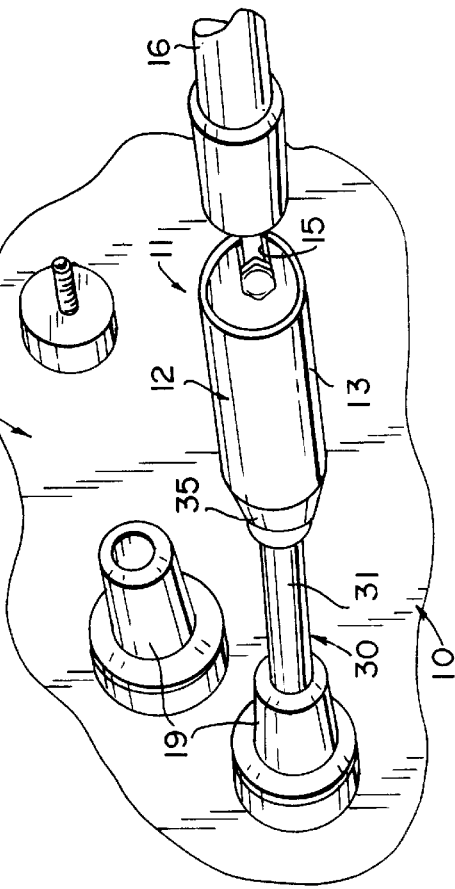
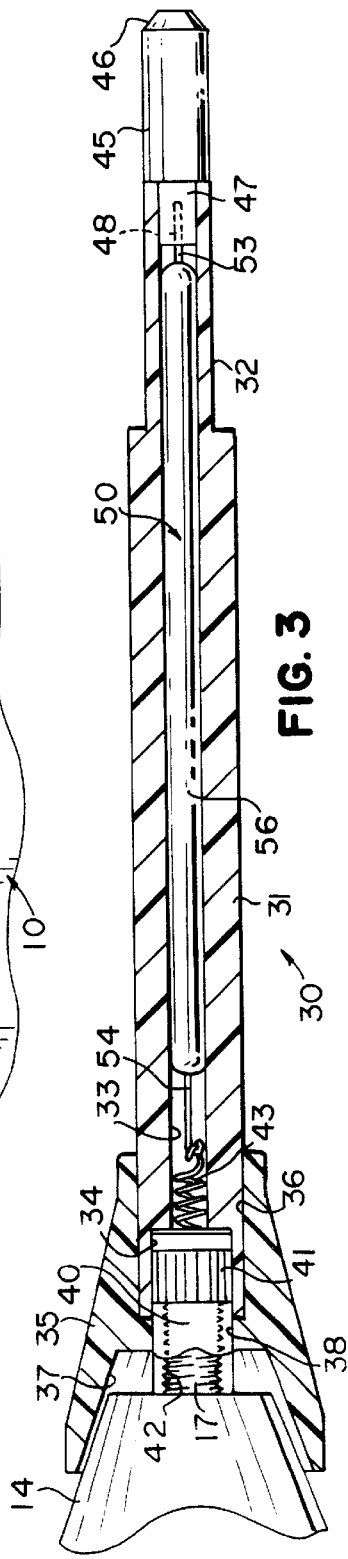

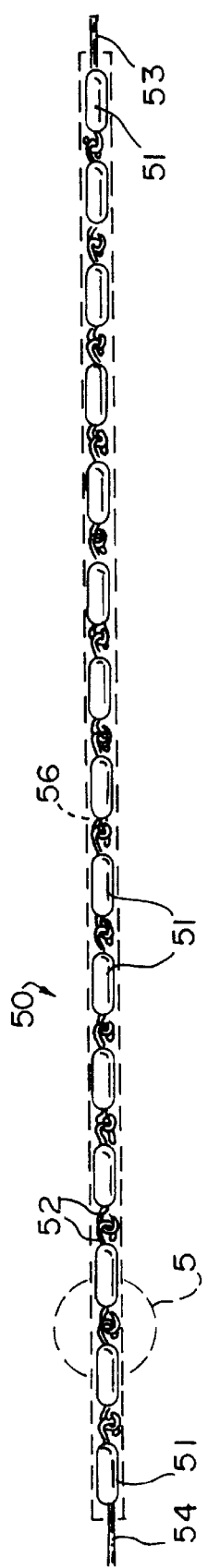
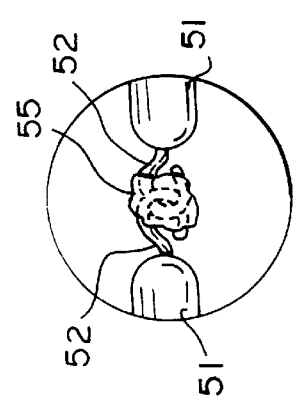
FIG. 4
FIG. 5

HIGH-RESISTANCE PROBE AND VOLTAGE DETECTOR INCORPORATING SAME

Background of the Invention

The invention relates to portable devices for testing electrical transmission or distribution equipment for the presence of high AC voltages in excess of one kilovolt.

In order to avoid accidental injury and/or equipment damage in the course of operation of or construction or maintenance work on electric power distribution and transmission systems, the work is commonly done after the installations have been disconnected from a source of energy. In order to verify that the equipment or conductors in question are in fact "dead" or disconnected, it is known to provide high-voltage detectors to test the conductor or equipment to verify the absence of high voltage. A line of such detectors is sold by HD Electric Company under the trade designation "TAG." The detector typically includes an insulating housing, which encloses the detection circuitry, and a probe on the housing adapted to make electrical contact with the conductor or other equipment to be tested, the housing being adapted for connection to an insulating "hot stick" to facilitate reaching the conductor or equipment. Different types of probes are utilized for different applications, such as overhead transmission and distribution wires and underground and pad-mounted gear.

In the latter application, certain types of metal enclosed equipment may present grounded surfaces in close proximity to the body of the probe (in the nature of an elongated tube with a conductive tip) and/or the attached voltage detector. For an inexperienced or unknowledgeable user, these grounded surfaces can provide an opportunity for a flashover which could expose the user and/or associated equipment to dangerously high currents.

SUMMARY OF THE INVENTION

It is a general object of the present invention to provide an improved high-voltage detector and probe assembly therefor which avoid the disadvantages of prior detectors and probe assemblies while affording additional structural and operating advantages.

An important feature of the invention is the provision of a probe assembly for a high-voltage detection device which can safely be used with underground and pad-mounted electrical transmission or distribution equipment.

In connection with the foregoing feature, another feature of the invention is the provision of a probe assembly of the type set forth which limits currents therethrough to safe levels.

Another feature of the invention is the provision of a high-voltage detection device incorporating a probe assembly of the type set forth.

Certain ones of these and other features of the invention may be attained by providing a probe assembly for a high voltage detector, the probe assembly comprising: an elongated tubular probe housing formed of electrically insulating material and having first and second ends, a connector at the first end of the housing for electrical connection to an associated voltage detector, a conductive probe tip projecting from the second end of the housing for contact with a conductor to be tested, and a high resistance disposed within the housing and connected in series between the tip and the connector, the resistance having a value such as to limit the current through the probe assembly to a safe level.

Other features of the invention may be attained by providing a device for testing a conductor for the presence of high AC voltage comprising: a probe assembly including a conductive probe tip for making electrical contact with the conductor, and a voltage detection circuit connected to the probe assembly, the probe assembly including a high resistance connected in series between the probe tip and the voltage detection circuit and having a value such as to limit the current through the probe assembly to a safe level.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a functional block diagrammatic view of a high-voltage detector assembly incorporating a probe assembly in accordance with the present invention;

FIG. 2 is a perspective view of a portion of an underground power distribution installation illustrating use of the present invention;

FIG. 3 is an enlarged, fragmentary view in vertical section of the probe assembly of the present invention;

FIG. 4 is a further enlarged view of the details of the resistance circuitry of the probe assembly of FIG. 3; and FIG. 5 is a further enlarged fragmentary view of the connection between adjacent ones of the resistors of FIG. 4.

DESCRIPTION OF THE PREFERRED EMBODIMENT

Referring to FIGS. 1–3, there is illustrated a detector assembly, generally designated by the numeral 10, constructed in accordance with and embodying the features of the present invention. The detector assembly 10 includes a voltage detector 11 coupled to a probe assembly 30. The voltage detector 11 is substantially the same as that sold by HD Electric Company under the trade designation "TAG 200," except that in place of the normal probe assembly used therewith, the probe assembly 30 in accordance with the present invention is utilized.

The voltage detector 11 has an elongated housing 12 having a circularly cylindrical portion 13, with a frustoconical portion 14 at one end thereof (FIG. 3) and provided at the other end thereof with a longitudinally extending slot 15 to receive a coupling stud or screw of an associated hot stick 16 of standard construction, to extend the user's reach, all in a known manner. The probe assembly 30 of the present invention is adapted particularly for use with underground and pad-mounted power distribution gear, which may have an access location 18 provided with socket bushings 19 for receiving an associated detector probe to contact the conductors of the distribution system, all in a known manner.

The voltage detector 11 has detection circuitry 20 disposed in the housing 12, which typically includes a capacitive divider 21, a rectifier 22, a threshold detector 23 and an annunciator 24, the detection circuitry 20 being generally of the type disclosed in U.S. Pat. No. 4,503,389, the disclosure of which is incorporated herein by reference. The capacitive divider 21 is connected to the stud 17 and the annunciator 24 may include an audible signaling device, such as a beeper or the like, and/or a visible signaling device, such as an LED or the like, in a known manner. In use, a probe assembly is coupled to the stud 17 and is adapted for connection to a conductor or other point of power distribution or transmission equipment to indicate the presence or absence of high (kilovolt range) AC voltages.

In accordance with the present invention, the voltage detector 11 is coupled to a probe assembly 30, which is specifically designed for use with underground and pad-mounted gear. The probe assembly 30 includes an elongated, tubular housing 31 formed of an electrically insulating material and having a reduced-diameter end portion 32 at one end thereof. The housing 31 defines an axial cylindrical bore 33 extending its length and communicating at the end opposite the reduced-diameter portion 32 with an enlarged-diameter counterbore 34. The probe assembly 30 also has a coupling skirt 35, which is generally frustoconically shaped and is provided at one end with an axial socket 36 dimensioned to receive therein the counterbored end of the tubular housing 31, the parts being secured together, as by a suitable epoxy. The skirt 35 has a generally frustoconical recess 37 formed in the other end thereof and an axial bore 38 providing communication between the socket 36 and the recess 37.

Secured in the counterbore 34 of the tubular housing 31 is an electrical connector 40, which is generally circularly cylindrical in shape, being provided with external knurling 41 to facilitate retention in the counterbore 34. In this regard, the connector 40 may be secured to the tubular housing 31 by any suitable means, such as by press-fitting, adhesive, insert molding and the like. The connector 40 projects through the bore 38 into the frustoconical recess 37 and has formed in the distal end thereof an internally threaded bore 42, disposed for threaded engagement with the stud 17 of the voltage detector 11, as can best be seen in FIG. 3. When the parts are thus secured together, the coupling skirt 35 overlaps the frustoconical portion 14 of the voltage detector housing 12. Fixedly secured to the inner end of the connector 40 and projecting into the bore 33 of the tubular housing 31 is a connector spring 43 in the form of a helical compression spring.

Secured to the reduced-diameter end portion 32 of the tubular housing 31 is a probe tip 45 formed of an electrically conducting material and being generally circularly cylindrical in shape, having an outer diameter substantially the same as that of the reduced-diameter end portion 32. The probe tip 45 is chamfered at its distal end, as at 46, to facilitate insertion in a socket bushing 19, and it is provided at its other end with a reduced-diameter end portion 47 dimensioned to be received in the adjacent end of the bore 33 of the tubular housing 31, being secured in place by any suitable means. For example, the probe tip 45 may be pinned to the tubular housing 31 by a pin extending through a radial bore (not shown) through the reduced-diameter end portions 32 and 47. The reduced-diameter portion 47 has an axial bore or socket 48 formed therein.

Referring now also to FIGS. 4 and 5, there is disposed in the bore 33 of the tubular housing 31 a high-resistance assembly 50, preferably formed of a plurality of resistors 51 connected in series. In the illustrated embodiment 15 of the resistors 51 are utilized and each preferably has a resistance of approximately 0.5 megohm, multiple resistors of this approximate resistance being utilized for economy, since they are typically less expensive than a single large-resistance element. In the preferred embodiment, each of the resistors 51 has a resistance of 470 kohm, ±5%, resulting in a total series resistance of 7.05 Mohm ±5%, i.e. a resistance in the range of from about 6.7 Mohm to about 7.4 Mohm. However, it will be appreciated that other resistance values could be utilized, depending upon the particular application.

Preferably, each of the resistors 51, except for the endmost resistors, is provided with a pair of generally hook-shaped end terminals 52, with the hooks of adjacent resistors being linked together. The resistor 51 at the forward end of the string has a straight terminal 53 adapted to be received in the axial socket 48 of the probe tip 45 and fixedly secured thereto by any suitable means, such as solder or the like. The resistor 51 at the rear end of the string has an elongated, generally J-shaped terminal 54, the hook end of which is hooked to the connector spring 43. Preferably, the hook coupling between adjacent resistors 51 is soldered, as at 55 (FIG. 5) to ensure good electrical connection, the overall soldered assembly of resistors being confined in a heat-shrink sleeve 56.

In operation, the probe tip 45 is inserted in a socket bushing 19 of an underground distribution system for contact with an associated conductor to detect the presence of high voltage, typically in the range of from about 2 kV to about 70 kV. If such a high voltage is present on the tested conductor, the high-resistance assembly 50 limits the current through the probe assembly 30 to a safe level. Thus, in the event that the probe assembly 30 makes contact with an earth ground, there is no risk of high-current damage to the operator or the equipment. For example, in the event of a 15-kV voltage, the current through the probe assembly 30 would be limited to about 2.1 ma. It is significant that the voltage detector 11 is simply for the purpose of generally indicating the presence or absence of a high AC voltage in the kilovolt range. Thus, the presence of the high-resistance assembly 50 does not significantly affect the operation of the voltage detector 11. For example, a typical current level through the voltage detector 11 may be in the range of about 10 microamperes, in which case the voltage drop across the high resistance assembly 50 would be about 70.5 volts, which is negligible when compared to the kilovolt range of the voltage being detected.

In a constructional model of the invention, the tubular housing 31 and the coupling skirt 35 of the probe assembly 30 are preferably formed of a suitable plastic material, such as PVc, while the probe tip 45 and the connector 40 are preferably formed of a suitable metal, such as brass.

From the foregoing, it can be seen that there has been provided an improved probe assembly for a high-voltage detector which effectively limits current through the probe assembly to a safe level. The probe assembly and the detector used therewith being of simple and economical construction.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A probe assembly for removable electrical and mechanical connection to a high voltage detector of the type having only a single probe terminal for contact with a conductor to be tested and no wired reference to ground, the probe assembly comprising:

an elongated tubular probe housing formed of electrically insulating material and having first and second ends, an electrically conductive connector fixed to the first end of the housing for removable direct electrical and mechanically supported connection to a complementary connector of an associated voltage detector, a conductive probe tip projecting from the second end of the housing for contact with a conductor to be tested, and a high resistance disposed within said housing and connected in series between said tip and said connector, said resistance having a value such as to limit the current through the probe assembly to a safe level.

2. The probe assembly of claim 1, wherein said probe housing has a frustoconical shield portion projecting from said first end and surrounding said connector.

3. The probe assembly of claim 1, wherein said connector is internally threaded.

4. The probe assembly of claim 1, wherein said high impedance including resistance in excess of 1 megohm.

5. The probe assembly of claim 4, wherein said resistance is in the range of from about 6 megohms to about 8 megohms.

6. The probe assembly of claim 4, wherein said resistance includes a plurality of resistors connected in series.

7. The probe assembly of claim 6, and further comprising heat-shrink tubing encapsulating said resistors.

8. The probe assembly of claim 6, wherein said resistance includes 15 resistors of substantially equal resistance.

9. The probe assembly of claim 6, wherein adjacent resistors are interconnected by hook-shaped terminals soldered together.

10. A device for testing a conductor for the presence of high A/C voltage comprising:

a probe assembly including a conductive probe terminal for making electrical contact with the conductor and a first fixed electrically conductive connector, and a voltage detection circuit having a second electrically conductive connector mateably engageable with the first connector to provide a removable electrical and mechanically supporting connection to the probe assembly, the voltage detector having no wired reference to ground, the probe assembly including a high resistance connected in series between the probe tip and the voltage detection circuit and having a value such as to limit the current through the probe assembly to a safe level.

11. The device of claim 10, wherein the first and second connectors are threadedly engageable with each other.

12. The device of claim 10, wherein said high impedance is a plurality of high resistance including substantially equal-valued resistors connected in series.

13. The device of claim 12, wherein said resistance includes 15 resistors each having a resistance of approximately 0.5 megohm.

14. The device of claim 10, wherein said voltage detection circuit includes a capacitive divider connected to said probe assembly.

15. The device of claim 14, wherein said voltage detection circuit includes a rectifier connected to said divider.

16. The device of claim 15, wherein said voltage detection circuit includes a threshold detector connected to said rectifier.

17. In a high voltage detector of the type having a voltage detection circuit and only a single probe terminal for contact with a conductor to be tested and no wired reference to ground, the improvement comprising:

a probe assembly including an elongated tubular probe housing formed of electrically insulating material and having first and second ends, a first electrically conductive threaded connector fixed to the first end of the housing, a conductive probe tip projecting from the second end of the housing and forming the single probe terminal for contact with a conductor to be tested, and a high resistance disposed within said housing and connected in series between said tip and said connector, said resistance having a value such as to limit the current through the probe assembly to a safe level, said voltage detection circuit including a second electrically conductive threaded connector threadedly engageable with the first connector to provide a removable electrical and mechanically supporting connection between the probe assembly and the voltage detection circuit.

18. The device of claim 17, wherein voltage detection circuit includes a capacitive divider connected to the probe assembly, a rectifier connected to the divider, and a threshold detector connected to the rectifier.

19. The device of claim 17, wherein said high impedance includes a plurality of resistors, each having a resistance of approximately 0.5 megohm, connected in series.

20. The device of claim 19, wherein said high impedance is resistance in the range of from about 6 megohms to about 8 megohms.

* * * * *

UNITED STATES PATENT AND TRADEMARK OFFICE
CERTIFICATE OF CORRECTION

PATENT NO. : 6,323,638 B2 Page 1 of 1
DATED : November 27, 2001
INVENTOR(S) : William J. McNulty It is certified that error appears in the above-identified patent and that said Letters Patent is hereby corrected as shown below:

Column 5,
Line 2, "A" should be -- An AC --;
Line 4, "contact with a" should be -- coupling with an AC-carrying --;
Line 5, "reference" should be -- connection --;
Lines 16 and 50, "resistance" should be -- impedance --;
Line 18, "resistance" should be -- impedance --, delete "the";
Line 19, after "level" insert -- without affecting operation of the associated voltage detector --;
Line 26, "including" should be -- includes --;
Line 49, "reference" should be -- connections --;

Column 6,
Lines 2 and 34, after "level" insert -- without affecting operation of the voltage detection circuit --;
Line 6, "plurality of high resistance including" should be -- high resistance including a plurality of --;
Line 19, after "high" insert -- AC --;
Line 21, "a" should be -- an AC-carrying --, "reference" should be -- connection --;
Lines 31 and 33, "resistance" should be -- impedance --;

Signed and Sealed this

Seventeenth Day of June, 2003

JAMES E. ROGAN
*Director of the United States Patent and Trademark Office*